(12) United States Patent
Tsai et al.

(10) Patent No.: US 7,324,098 B1
(45) Date of Patent: Jan. 29, 2008

(54) DRIVING CIRCUIT FOR DISPLAY DEVICE

(75) Inventors: Cheng-Hung Tsai, Changhua County (TW); Chun-Yao Huang, Hsinchu (TW); He-Cheng Chen, Taichung County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 8 days.

(21) Appl. No.: 11/459,935

(22) Filed: Jul. 26, 2006

(51) Int. Cl.
*G06F 3/038* (2006.01)
*G09G 5/00* (2006.01)

(52) U.S. Cl. ............... 345/204; 345/214; 345/698
(58) Field of Classification Search ........... 345/204, 345/214, 698
See application file for complete search history.

(56) References Cited

U.S. PATENT DOCUMENTS

| | | | |
|---|---|---|---|
| 6,467,057 B1 | 10/2002 | Wang et al. | |
| 6,784,880 B2 * | 8/2004 | Fujita et al. | 345/213 |
| 6,924,869 B2 | 8/2005 | Yu | |
| 2004/0174330 A1 | 9/2004 | Huang et al. | |
| 2004/0178983 A1 | 9/2004 | Tsai et al. | |
| 2004/0257351 A1 * | 12/2004 | Ishii | 345/204 |
| 2005/0046439 A1 | 3/2005 | Yu | |
| 2005/0052393 A1 * | 3/2005 | Kobashi | 345/96 |
| 2005/0057480 A1 | 3/2005 | Liao et al. | |
| 2005/0206607 A1 * | 9/2005 | Koyama et al. | 345/100 |
| 2005/0248558 A1 * | 11/2005 | Kobashi | 345/204 |

FOREIGN PATENT DOCUMENTS

JP    2002-169518    6/2002

* cited by examiner

*Primary Examiner*—Rexford Barnie
*Assistant Examiner*—Jason Crawford
(74) *Attorney, Agent, or Firm*—Jianq Chyun IP Office

(57) ABSTRACT

A driving circuit for a display device includes a first trigger signal generating stage, a second trigger signal generating stage, . . . , and an n-th trigger signal generating stage, where n is an integer larger than 0. The i-th shift register performs a tri-state inversion on an input signal of the i-th trigger signal generating stage to obtain an i-th tri-state inversion signal, and then performs the tri-state inversion on the i-th tri-state inversion signal to obtain an input signal of the (i+1)-th trigger signal generating stage. The i-th logic gate generates an i-th logic signal according to the i-th tri-state inversion signal and the input signal of the (i+1)-th trigger signal generating stage. The (i−1)-th trigger signal generating stage generates an (i−1)-th trigger signal generating signal according to the i-th logic signal.

10 Claims, 4 Drawing Sheets

DRIVING CIRCUIT FOR DISPLAY DEVICE

BACKGROUND OF THE INVENTION

1. Field of Invention

The present invention relates to a driving circuit for a display device. More particularly, the present invention relates to a driving circuit for a display device without need for an output enable signal, thus saving energy consumption.

2. Description of Related Art

Conventional driving circuit for a display device comprises a gate driver and a source driver. Both the gate driver and the source driver comprise a trigger signal generating circuit. In the gate driver, the trigger signal generating circuit, such as, used as a scanning circuit, is used to generate a gate on/off signal for controlling the on/off of pixels. Whereas, in the source driver, the trigger signal generating circuit is used as a shift register for generating a plurality of trigger signals for triggering a data latch.

Conventional scanning circuits perform a logic (AND) operation on a signal generated by a shift register and an output enable signal OE to achieve the effect of separating scanning signals of two neighboring scanning stages of the scanning circuit, thus avoiding display errors caused by neighboring scanning signal lines being turned on simultaneously. The circuits of each scanning stage of a conventional scanning circuit are shown in FIG. 1.

FIG. 1 is a circuit diagram of each scanning stage of the conventional scanning circuit. Referring to FIG. 1, the circuit includes a first tri-state inverter 101, a first inverter 102, a second tri-state inverter 103, a third tri-state inverter 104, a second inverter 105, a fourth tri-state inverter 106, an NAND gate 107, and a third inverter 108. Each tri-state inverter has a clock input end and an inversion clock input end.

The first tri-state inverter 101 receives an input signal IN generated by the previous scanning stage (however, the input signal IN of the first scanning stage is an external input signal input from the outside of the scanning circuit) and performs a tri-state inversion on the input signal according to a clock signal CK and an inversion clock signal CKB and then outputs it. The inversion clock signal CKB is obtained by inverting the clock signal CK. The actions of the tri-state inversion are described as follows. If the input signal IN is logic 1 (i.e., high potential) and the clock signal CK is also logic 1 at this time, the first tri-state inverter 101 inverts the input signal IN to be logic 0 (i.e., low potential). However, if the clock signal CK is logic 0 at this time, the first tri-state inverter 101 keeps the input signal IN to be logic 1. If the input signal IN is logic 0 and the clock signal CK is also logic 0 at this time, the first tri-state inverter 101 inverts the input signal IN to be logic 1. However, if the clock signal CK is logic 1 at this time, the first tri-state inverter 101 keeps the input signal IN to be logic 0. The true value of the tri-state inversion is described as follows.

| Input Signal IN | Clock Signal CK | Output Signal of Tri-State Inverter |
| --- | --- | --- |
| 0 | 0 | 1 |
| 0 | 1 | 0 |
| 1 | 0 | 1 |
| 1 | 1 | 0 |

The actions of the tri-state inversion in the following refer to the action of the first tri-state inverter 101 as shown in FIG. 1 and will not be described again.

The first inverter 102 receives an output of the first tri-state inverter 101, performs an inversion on the output of the first tri-state inverter 101, and then outputs it. The second tri-state inverter 103 performs the tri-state inversion on the output of the first inverter 102 according to the clock signal CK and the inversion clock signal CKB and then outputs it. An output of the second tri-state inverter 103 is also fed back to the input of the first inverter 102. The third tri-state inverter 104 performs the tri-state inversion on the output of the second tri-state inverter 103 according to the clock signal CK and the inversion clock signal CKB and then outputs it. The second inverter 105 receives the output of the third tri-state inverter 104, performs the inversion on the output of the third tri-state inverter 104, and then outputs it. The fourth tri-state inverter 106 also performs the tri-state inversion on the output of the second inverter 105 according to the clock signal CK and the inversion clock signal CKB. The output of the fourth tri-state inverter 106 is also fed back to the input of the second inverter 105. The output signal of the fourth tri-state inverter 106 is the input signal of next scanning stage.

Then, a logic operation is performed on the output of the second inverter 105 and the output enable signal OE by the NAND gate 107 and the third inverter 108, so as to generate a scanning signal OUTPUT1. The scanning signal OUTPUT1 is the signal generated by the first scanning stage and is used for the display unit (pixel) in the driving panel. Thus, scanning signals OUTPUT1-OUTPUTN not being overlapped one another can be obtained. The scanning signal OUTPUTN represents the scanning signal generated by the n-th scanning stage. The relation between the output enable signal OE and the scanning signal output by each scanning stage is illustrated by the use of the scanning signals output by five continuous scanning stages, as shown in FIG. 2.

FIG. 2 shows waveforms of the scanning signals output by five continuous scanning stages of the conventional scanning circuit. Referring to FIG. 2, IN as shown in FIG. 2, indicates an external input signal; CK indicates a clock signal; OE indicates an output enable signal; and OUTPUT1-OUTPUT5 indicates the scanning signals output by the first scanning stage, the second scanning stage, . . . , and the fifth scanning stage. It can be known from the FIG. 2 that after the pulse (201, as shown in FIG. 2) of the external input signal IN is input into the scanning circuit, the time difference between every two scanning signals (202 and 203, as shown in FIG. 2) in the scanning signals OUTPUT1-OUTPUT5 output by the first scanning stage, the second scanning stage, . . . , and the fifth scanning stage, is equal to the time difference between two pulses of the output enable signal OE (204 and 205, as shown in FIG. 2). The relationship among the pulses 202, 203, 204, and 205 is indicated by two dot lines (206 and 207, as shown in FIG. 2). Moreover, the pulse width of each scanning signal is also equal to the pulse width of the output enable signal OE. The pulse 208 and pulse 201 are the pulse of the external input signal IN.

However, it can be known from the FIG. 2 that the output enable signal OE are required to prevent the neighboring scanning signals from being overlapped according to the conventional technology, thus causing additional power consumption.

SUMMARY OF THE INVENTION

The object of the present invention is to provide a driving circuit for a display device without need for an output enable signal, which achieves the effect of separating neighboring trigger signals.

In order to achieve the above and other objects, the present invention provides a driving circuit for a display device, wherein an i-th trigger signal generating stage (i is an integer between 1 and n) includes an i-th shift register and an i-th logic gate. The i-th shift register performs the tri-state inversion on an input signal of the i-th trigger signal generating stage generated by the (i−1)-th trigger signal generating stage to obtain an i-th tri-state inversion signal, then performs the tri-state inversion on the i-th tri-state inversion signal to obtain an input signal of the (i+1)-th trigger signal generating stage. The i-th logic gate generates an i-th logic signal according to the i-th tri-state inversion signal and the input signal of the (i+1)-th trigger signal generating stage. The (i−1)-th trigger signal generating stage generates an (i−1)-th scanning signal according to the i-th logic signal.

According to the preferred embodiment of the present invention, each i-th logic gate of the above scanning circuit includes a first transistor, a second transistor, a third transistor, a fourth transistor, a fifth transistor, a sixth transistor, a seventh transistor, and an eighth transistor.

The first transistor is electrically connected to a voltage source, and determines an on/off state according to the i-th tri-state inversion signal. The second transistor is electrically connected to the first transistor, and determines the on/off state according to the input signal of the (i+1)-th trigger signal generating stage. The third transistor is electrically connected to the second transistor, and determines the on/off state according to the i-th tri-state inversion signal. The fourth transistor is electrically connected between the third transistor and the ground end, and determines the on/off state according to an inversion signal of the input signal of the (i+1)-th trigger signal generating stage.

The fifth transistor is electrically connected to the voltage source, and determines the on/off state according to an inversion signal of the i-th tri-state inversion signal. The sixth transistor is electrically connected to the fifth transistor, and determines the on/off state according to the inversion signal of the input signal of the (i+1)-th trigger signal generating stage. The seventh transistor is electrically connected to the sixth transistor and the second transistor, and determines the on/off state according to the inversion signal of the i-th tri-state inversion signal. The i-th logic signal is output at the point where the seventh transistor, the sixth transistor, the second transistor, and the third transistor are electrically connected one another. The eighth transistor is electrically connected between the seventh transistor and the ground end, and determines the on/off state according to the input signal of the (i+1)-th trigger signal generating stage.

According to the preferred embodiment of the present invention, the i-th trigger signal generating stage of the scanning circuit is fitted with an i-th logic gate. The i-th trigger signal generating stage is used to perform the tri-state inversion on the input signal thereof to obtain the i-th tri-state inversion signal, and perform the tri-state inversion on the i-th tri-state inversion signal to obtain the input signal of the (i+1)-th trigger signal generating stage. The i-th logic gate is used to generate the i-th logic signal according to the i-th tri-state inversion signal generated by the i-th trigger signal generating stage and the inversion signal thereof, and the input signal of the (i+1)-th trigger signal generating stage and the inversion signal thereof. Thus the (i−1)-th trigger signal generating stage is used to generate the (i−1)-th scanning signal according to the i-th logic signal, and the i-th trigger signal generating stage is used to generate the i-th scanning signal according to the (i+1)-th logic signal output by the (i+1)-th trigger signal generating stage and the input signal of the (i+1)-th trigger signal generating stage generated by the i-th trigger signal generating stage. Thus, the scanning circuit of the present invention can achieve the effect of separating the two neighboring trigger signals without need for the output enable signal.

In order to the make aforementioned and other objects, features and advantages of the present invention comprehensible, preferred embodiments accompanied with figures are described in detail below.

DESCRIPTION OF EMBODIMENTS

Figure 1:
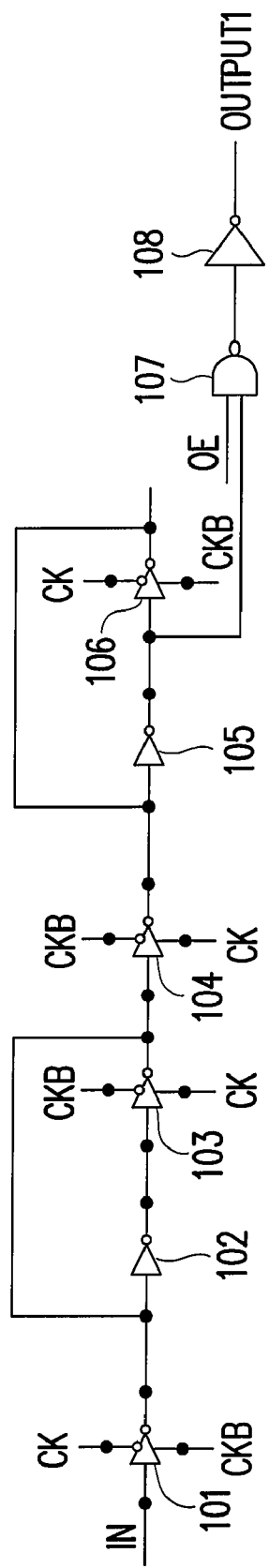
FIG. 1 is a circuit diagram of the scanning stages of the conventional scanning circuit.
Figure 2:
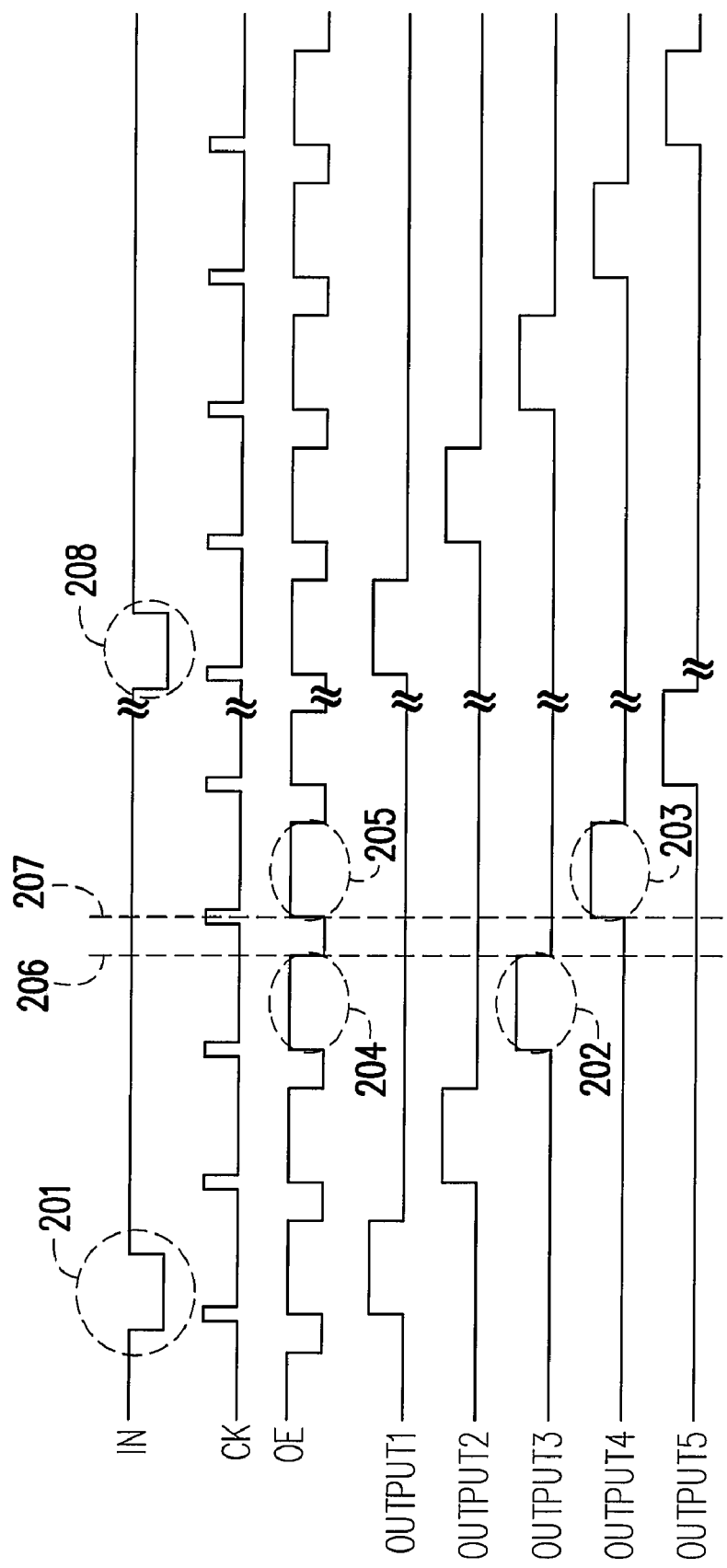
FIG. 2 shows waveforms of the scanning signals output by five continuous scanning stages of the conventional scanning circuit.
Figure 3:
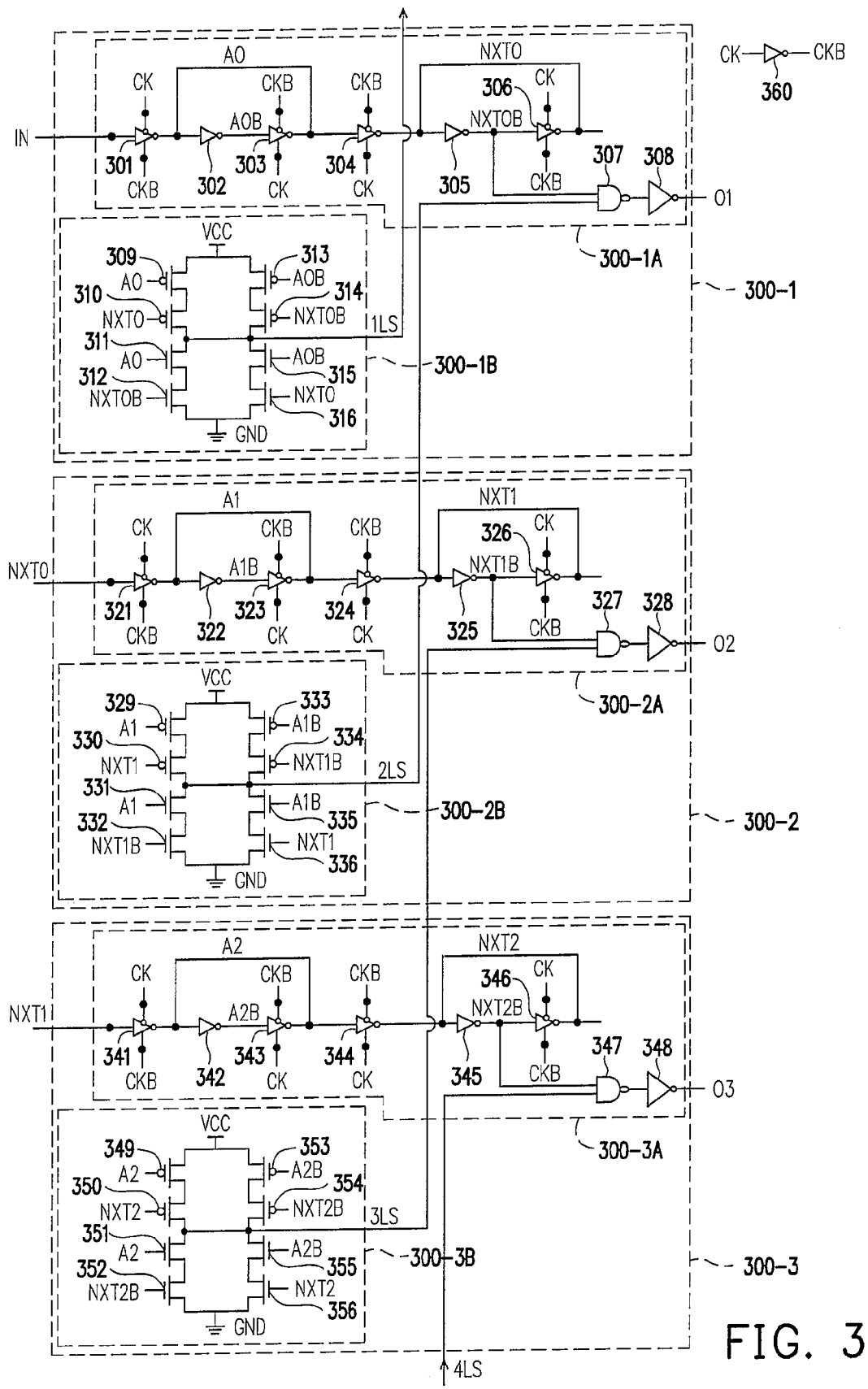
FIG. 3 is a circuit diagram of the first three scanning stages 300-1, 300-2, and 300-3 in the scanning circuit according to a preferred embodiment of the present invention.

FIG. 3 is a circuit diagram of the first three scanning stages (trigger signal generating stages) 300-1, 300-2, and 300-3 of the driving circuit for a display device according to a preferred embodiment of the present invention. Taking a panel with a resolution of 640*480 as an example, if the driving circuit is used for driving a gate, 640 scanning stages must be included. In the following, the preferred embodiment takes a driving circuit of a gate driver as an example. It is obvious that this embodiment also can be used as a shift register of a source driver. Additionally, the embodiment can be applied to a display device with a reflective liquid crystal of silicon (LCoS), in addition to with a thin film transistor liquid crystal (FTF-LCD).

The first scanning stage 300-1 includes a first shift register 300-1A and a first logic gate 300-1B. The first shift register 300-1A includes a first tri-state inverter 301, a first inverter 302, a second tri-state inverter 303, a third tri-state inverter 304, a second inverter 305, a fourth tri-state inverter 306, an NAND gate 307, and a third inverter 308. The first tri-state inverter 301 receives an input signal IN (an external input signal) and performs a tri-state inversion on the external input signal according to a clock signal CK and an inversion clock signal CKB to obtain a first tri-state inversion signal A0. The inversion clock signal CKB is obtained through inverting the clock signal CK by the fourth inverter 360 of the scanning circuit.

The first inverter 302 performs an inversion on the first tri-state inversion signal A0 output by the first tri-state inverter 301 to obtain an inversion signal A0B thereof. The input of the first inverter 302 is also electrically connected to the output of the second tri-state inverter 303. The second tri-state inverter 303 performs the tri-state inversion on the inversion signal A0B of first tri-state inversion signal A0 output by the first inverter 302 according to the clock signal CK and the inversion clock signal CKB to generate the first tri-state inversion signal A0. The third tri-state inverter 304 performs the tri-state inversion on the first tri-state inversion signal A0 according to the clock signal CK and the inversion clock signal CKB to obtain a signal NXT0. The signal NXT0 is used as an input signal of the second scanning stage 300-2.

The second inverter 305 performs the inversion on the signal NXT0 output by the third tri-state inverter 304 to obtain an inversion signal NXT0B thereof. The input of the second inverter 305 is also electrically connected to the output of the fourth tri-state inverter 306. The fourth tri-state inverter 306 performs the tri-state inversion on the signal NXT0B according to the clock signal CK and the inversion clock signal CKB to generate the signal NXT0 again.

The NAND gate 307 receives the output signal NXT0B of the second inverter 305 and a second logic signal 2LS output by the second scanning stage 300-2. The third inverter 308 receives and performs the inversion on the output signal of the NAND gate 307 to generate a first scanning signal O1.

Since the first logic signal 1LS output by the first logic gate 300-1B of the first scanning stage 300-1 does not provide actual function, the user can determine whether to use the first logic gate 300-1B as desired. However, for the convenience of illustration, the first logic gate 300-1B is still described. In the embodiment, the first logic gate 300-1B is an exclusive NOR logic gate, which includes a first transistor 309, a second transistor 310, a third transistor 311, a fourth transistor 312, a fifth transistor 313, a sixth transistor 314, a seventh transistor 315, an eighth transistor 316. The first transistor 309, the second transistor 310, the fifth transistor 313, and the sixth transistor 314 are P-type MOS transistors, while the third transistor 311, the fourth transistor 312, the seventh transistor 315, and the eighth transistor 316 are N-type MOS transistors.

The first transistor 309 has the source electrically connected to a voltage source VCC, the gate for receiving the first tri-state inversion signal A0, and the drain electrically connected to the source of the second transistor 310. The first transistor 309 determines the on/off state according to the first tri-state inversion signal A0. The second transistor 310 has the source electrically connected to the drain of the first transistor 309, the gate for receiving the signal NXT0, and the drain electrically connected to the drain of the third transistor 311. The second transistor 310 determines the on/off state according to the signal NXT0. The third transistor 311 has the drain electrically connected to the drain of the second transistor 310, the gate for receiving the first tri-state inversion signal A0, and the source electrically connected to the drain of the fourth transistor 312. The third transistor 311 determines the on/off state according to the first tri-state inversion signal A0. The fourth transistor 312 has the drain electrically connected to the source of the third transistor 311, the gate for receiving the signal NXT0B, and the source electrically connected to the ground end GND. The fourth transistor 312 determines the on/off state according to the signal NXT0B.

The fifth transistor 313 has the source electrically connected to the voltage source VCC, the gate for receiving the inversion signal A0B, and the drain electrically connected to a source of the sixth transistor 314. The fifth transistor 313 determines the on/off state according to the inversion signal A0B. The sixth transistor 314 has the source electrically connected to the drain of the fifth transistor 313, the gate for receiving the inversion signal NXT0B, and the drain electrically connected to the drain of the seventh transistor 315. The sixth transistor 314 determines the on/off state according to the inversion signal NXT0B. The seventh transistor 315 has the drain electrically connected to the drain of the sixth transistor 314 and the drain of the second transistor 310, the gate for receiving the signal A0B, and the source electrically connected to the drain of the eighth transistor 316. The seventh transistor 315 determines the on/off state according to the signal A0B. The eighth transistor 316 has the drain electrically connected to the source of the seventh transistor 315, the gate for receiving the signal NXT0, and the source electrically connected to the ground end GND. The eighth transistor 316 determines the on/off state according to the signal NXT0. The first logic gate 300-1B outputs the first logic signal 1LS (i.e., the output of the first logic gate 300-1B) at the point where the seventh transistor 315, the sixth transistor 314, the second transistor 310, and the third transistor 311 are electrically connected one another. The first logic signal 1LS is obtained by performing the exclusive NOR operation on the first tri-state inversion signal A0 and the signal NXT0. The exclusive NOR operation is expressed by the formula of A0⊙NXT0=A0·NXT0+A0B·NXT0B.

Although the exclusive NOR logic gate is implemented in the embodiment, the present invention is not limited to this. It is apparent to those skilled in the art that various variations can be made to the structure of the logic gates 300-1B-300-NB without departing from the scope of the invention.

The second scanning stage 300-2 includes a second shift register 300-2A and a second logic gate 300-2B. The second shift register 300-2A includes a first tri-state inverter 321, a first inverter 322, a second tri-state inverter 323, a third tri-state inverter 324, a second inverter 325, a fourth tri-state inverter 326, an NAND gate 327, and a third inverter 328. The interconnection relation of the devices of the second shift register 300-2A and actions thereof are the same as or similar to those of the first shift register 300-1A, and will not be described herein again.

The second logic gate 300-2B includes a first transistor 329, a second transistor 330, a third transistor 331, a fourth transistor 332, a fifth transistor 333, a sixth transistor 334, a seventh transistor 335, and an eighth transistor 336. The interconnection relation of the devices of the second logic gate 300-2B and actions thereof are the same as or similar to those of the first logic gate 300-1B, and will not be described herein again.

However, the input signal NXT0 of the first tri-state inverter 321 of the second shift register 300-2A (i.e., the input signal NXT0 of the second scanning stage 300-2) is output by the third tri-state inverter 304 of the first shift register 300-1A of the first scanning stage 300-1. The output of the first tri-state inverter 321 of the second scanning stage 300-2 is defined as a second tri-state inversion signal A1. A signal A1B is an inversion signal of the second tri-state inversion signal A1. An output signal NXT1 of the third tri-state inverter 324 of the second scanning stage 300-2 is the input signal of the third scanning stage 300-3. A signal NXT1B is an inversion signal of the signal NXT1.

The output of the second logic gate 300-2B is defined as the second logic signal 2LS, and the second logic signal 2LS is electrically connected to the NAND gate 307 of the first scanning stage 300-1 to obtain the first scanning signal O1 of the first scanning stage 300-1.

The third scanning stage 300-3 includes a third shift register 300-3A and a third logic gate 300-3B. The third shift register 300-3A includes a first tri-state inverter 341, a first inverter 342, a second tri-state inverter 343, a third tri-state inverter 344, a second inverter 345, a fourth tri-state inverter 346, an NAND gate 347, and a third inverter 348. The interconnection relation of the devices of the third shift register 300-3A and actions thereof are the same as or similar to those of the first shift register 300-1A, and will not be described herein again.

The third logic gate 300-3B includes a first transistor 349, a second transistor 350, a third transistor 351, a fourth transistor 352, a fifth transistor 353, a sixth transistor 354, a seventh transistor 355, and an eighth transistor 356. The interconnection relation of the devices of the third logic gate 300-3B and actions thereof are the same as or similar to those of the first logic gate 300-1B, and will not be described herein again.

The electrical connection method and definition of each signal of the third scanning stage 300-3 are the same as or similar to those of the second scanning stage 300-2 and will not be described herein again. The second scanning stage 300-2 generates a second scanning signal O2 of the second scanning stage 300-2 according to a third logic signal 3LS output by the third scanning stage 300-3. Similarly, the third scanning stage 300-3 outputs a third scanning signal O3 of the third scanning stage 300-3 according to a fourth logic signal 4LS output by the fourth scanning stage (not shown). The electrical connection method and action of each scanning stage following the third scanning stage 300-3 (i.e., the fourth scanning stage to n-th scanning stage) can all be deduced according to the electrical connection method and action of the second scanning stage 300-2 or the third scanning stage 300-3 described above, and will not be described herein again.

Figure 4:
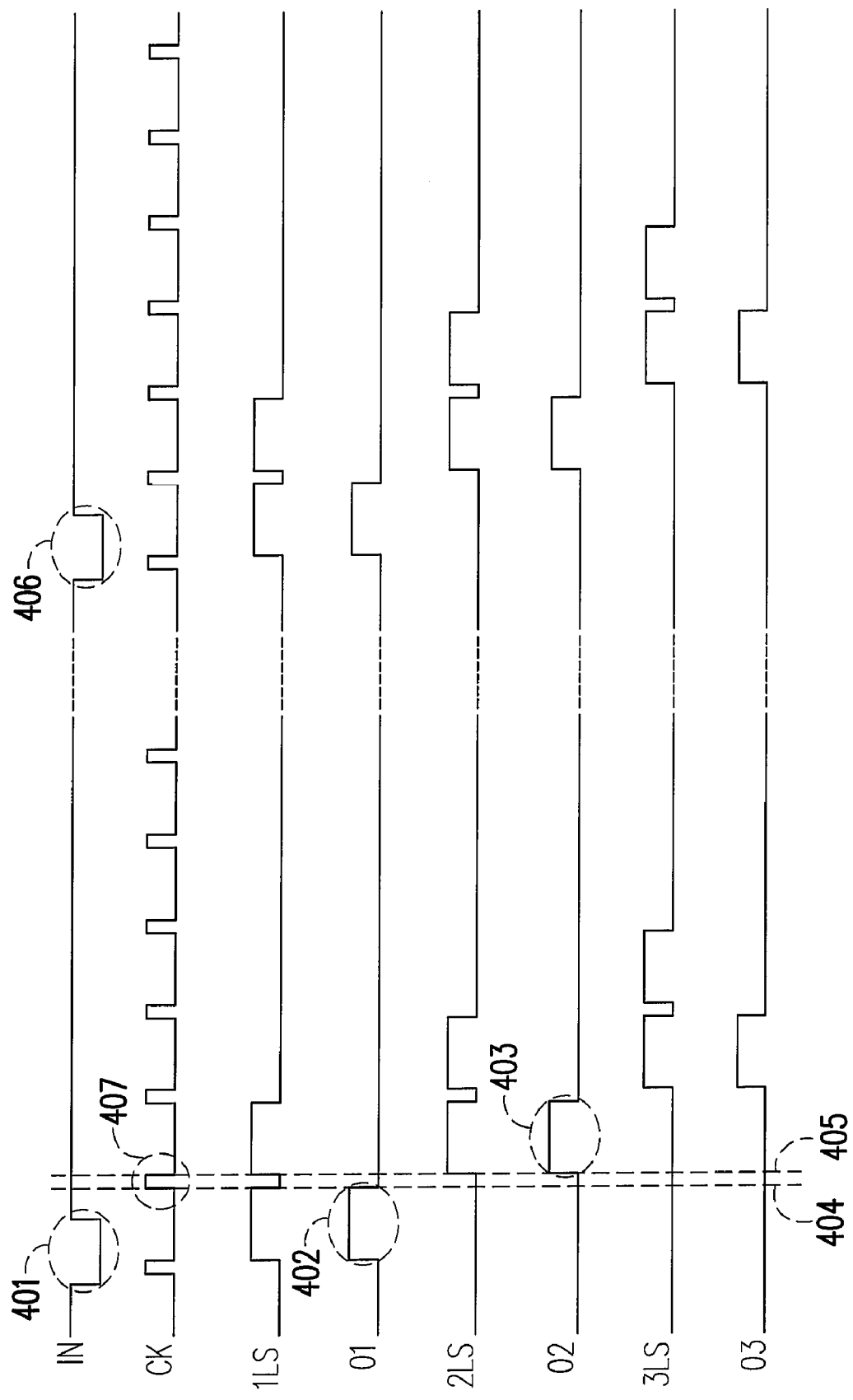
FIG. 4 is a timing diagram of the signals of the first three scanning stages of the scanning circuit according to a preferred embodiment of the present invention.

FIG. 4 is a timing diagram of the signals of the first three scanning stages of a scanning circuit according to the embodiment. Referring to FIG. 3, IN as shown in FIG. 3 indicates an external input signal received by the first scanning stage 300-1; CK indicates a clock signal; 1LS indicates a first logic signal output by the first scanning stage 300-1; O1 indicates a first scanning signal output by the first scanning stage 300-1; 2LS indicates a second logic signal output by the second scanning stage 300-2; O2 indicates a second scanning signal output by the second scanning stage 300-2; 3LS indicates a third logic signal output by the third scanning stage 300-3; and O3 indicates a third scanning signal output by the third scanning stage 300-3.

It can be seen from FIG. 4 that after the pulse 401 of the external input signal IN is input into the scanning circuit, the time differences between the scanning signals O1-O3 output by the first scanning stage 300-1 to the third scanning stage 300-3 are just equal to the clock signal CK. For example, the time difference between the pulses 402 and 403 is equal to the width of the pulse 407. The relationships among the above pulses 402, 403, and 407 can be indicated by two dot lines (404 and 405, as shown in FIG. 4). The pulse 406 and the pulse 401 are the pulses of the external input signal IN.

To summarize, the present invention provides the i-th scanning stage of the scanning circuit fitted with an i-th logic gate. The i-th scanning stage performs the tri-state inversion on the input signal thereof to obtain the i-th tri-state inversion signal, and performs the tri-state inversion on the i-th tri-state inversion signal to obtain the input signal of the (i+1)-th scanning stage. The i-th logic gate is generates the i-th logic signal according to the i-th tri-state inversion signal generated by the i-th scanning stage and the inversion signal thereof, and the input signal of the (i+1)-th scanning stage and the inversion signal thereof. Thus the (i−1)-th scanning stage can generate the (i−1)-th scanning signal according to the i-th logic signal, and the i-th scanning stage generates the i-th scanning signal according to the (i+1)-th logic signal output by the (i+1)-th scanning stage and the input signal of the (i+1)-th scanning stage generated by the i-th scanning stage. Thus, the scanning circuit of the present invention can achieve the effect of separating the scanning signals of two neighboring scanning stages of the scanning circuit without need for the output enable signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving circuit for a display device, comprising a first trigger signal generating stage, a second trigger signal generating stage, . . . , and an n-th trigger signal generating stage, where n is an integer larger than 0, wherein:

the first trigger signal generating stage comprises a first shift register to perform a tri-state inversion on an external input signal to obtain a first tri-state inversion signal and the tri-state inversion on the first tri-state inversion signal to obtain an input signal of the second trigger signal generating stage, and further to generate a first scanning signal according to a second logic signal of the second trigger signal generating stage; and the i-th trigger signal generating stage comprises an i-th shift register and an i-th logic gate, where i is an integer between 2 and n, wherein the i-th shift register performs the tri-state inversion on an input signal of the i-th trigger signal generating stage generated by the (i−1)-th trigger signal generating stage to obtain an i-th tri-state inversion signal, and then performs the tri-state inversion on the i-th tri-state inversion signal to obtain an input signal of the (i+1)-th trigger signal generating stage; the i-th logic gate generates an i-th logic signal according to the i-th tri-state inversion signal and the input signal of the (i+1)-th trigger signal generating stage; and the (i−1)-th trigger signal generating stage generates the (i−1)-th trigger signal according to the i-th logic signal.

2. The driving circuit as claimed in claim 1, wherein the first shift register comprises:

a first tri-state inverter, for performing the tri-state inversion on the external input signal according to a clock signal and an inversion clock signal to obtain the first tri-state inversion signal, wherein the inversion clock signal is obtained by inverting the clock signal;

a first inverter, for performing the inversion on the first tri-state inversion signal output by the first tri-state inverter to obtain an inversion signal thereof;

a second tri-state inverter, for performing the tri-state inversion on the inversion signal of the first tri-state inversion signal output by the first inverter according to the clock signal and the inversion clock signal to generate the first tri-state inversion signal;

a third tri-state inverter, for performing the tri-state inversion on the first tri-state inversion signal according to the clock signal and the inversion clock signal to obtain the input signal of the second trigger signal generating stage;

a second inverter, for performing the inversion on the input signal of the second trigger signal generating stage output by the third tri-state inverter to obtain an inversion signal thereof;

a fourth tri-state inverter, for performing the tri-state inversion on the inversion signal of the input signal of the second trigger signal generating stage output by the second inverter according to the clock signal and the inversion clock signal to generate the input signal of the second trigger signal generating stage;

an NAND gate, for performing an NAND logic operation according to the inversion signal of the input signal of the second trigger signal generating stage output by the second inverter and a second logic signal output by the second trigger signal generating stage to generate an NAND signal; and a third inverter, for receiving and performing the inversion on the NAND signal to generate the first trigger signal.

3. The driving circuit as claimed in claim 2, wherein the i-th shift register comprises:

a first tri-state inverter, for performing the tri-state inversion on the input signal of the i-th trigger signal generating stage generated by the (i−1)-th trigger signal generating stage according to the clock signal and the inversion clock signal to obtain the i-th tri-state inversion signal;

a first inverter, for performing the inversion on the i-th tri-state inversion signal output by the first tri-state inverter to obtain an inversion signal thereof;

a second tri-state inverter, for performing the tri-state inversion on the inversion signal of the i-th tri-state inversion signal output by the first inverter according to the clock signal and the inversion clock signal to generate the i-th tri-state inversion signal;

a third tri-state inverter, for performing the tri-state inversion on the i-th tri-state inversion signal according to the clock signal and the inversion clock signal to obtain the input signal of the (i+1)-th trigger signal generating stage;

a second inverter, for performing the inversion on the input signal of the (i+1)-th trigger signal generating stage output by the third tri-state inverter to obtain an inversion signal thereof;

a fourth tri-state inverter, for performing the tri-state inversion on the inversion signal of the input signal of the (i+1)-th trigger signal generating stage according to the clock signal and the inversion clock signal to generate the input signal of the (i+1)-th trigger signal generating stage;

an NAND gate, for performing an NAND logic operation according to the inversion signal of the input signal of the (i+1)-th trigger signal generating stage and an (i+1)-th logic signal output by the (i+1)-th trigger signal generating stage to generate an NAND signal; and a third inverter, for receiving and performing the inversion on the NAND signal to generate the i-th trigger signal.

4. The driving circuit as claimed in claim 3, wherein the i-th logic gate comprises:

a first transistor electrically connected to a voltage source, for determining an on/off state according to the i-th tri-state inversion signal;

a second transistor electrically connected to the first transistor, for determining the on/off state according to the input signal of the (i+1)-th trigger signal generating stage;

a third transistor electrically connected to the second transistor, for determining the on/off state according to the i-th tri-state inversion signal;

a fourth transistor electrically connected between the third transistor and the ground end, wherein the fourth transistor for determining the on/off state according to the inversion signal of the input signal of the (i+1)-th trigger signal generating stage;

a fifth transistor electrically connected to the voltage source, for determining the on/off state according to the inversion signal of the i-th tri-state inversion signal;

a sixth transistor electrically connected to the fifth transistor, for determining the on/off state according to the inversion signal of the input signal of the (i+1)-th trigger signal generating stage;

a seventh transistor electrically connected to the sixth transistor and the second transistor, for determining the on/off state according to the inversion signal of the i-th tri-state inversion signal, and outputting the i-th logic signal at an node where the seventh transistor, the sixth transistor, the second transistor, and the third transistor are electrically connected one another; and an eighth transistor electrically connected between the seventh transistor and the ground end, for determining the on/off state according to the input signal of the (i+1)-th trigger signal generating stage.

5. The driving circuit as claimed in claim 2, further comprises a fourth inverter for receiving the clock signal to generate the inversion clock signal.

6. A driving circuit for a display device, comprising a first trigger signal generating stage, a second trigger signal generating stage, . . . , and an n-th trigger signal generating stage, where n is an integer larger than 0, wherein:

the i-th trigger signal generating stage comprises an i-th shift register and an i-th logic gate, where i is an integer between 1-n, wherein the i-th shift register performs the tri-state inversion on an input signal of the i-th trigger signal generating stage generated by the (i−1)-th trigger signal generating stage to obtain an i-th tri-state inversion signal, and then performs the tri-state inversion on the i-th tri-state inversion signal to obtain an input signal of the (i+1)-th trigger signal generating stage; the i-th logic gate generates an i-th logic signal according to the i-th tri-state inversion signal and the input signal of the (i+1)-th trigger signal generating stage; and the (i−1)-th trigger signal generating stage generates the (i−1)-th trigger signal according to the i-th logic signal.

7. The driving circuit as claimed in claim 6, wherein the i-th shift register comprises:

a first tri-state inverter, for performing the tri-state inversion on the input signal of the i-th trigger signal generating stage generated by the (i−1)-th trigger signal generating stage according to a clock signal and an inversion clock signal to obtain the i-th tri-state inversion signal;

a first inverter, for performing the inversion on the i-th tri-state inversion signal output by the first tri-state inverter to obtain an inversion signal thereof;

a second tri-state inverter, for performing the tri-state inversion on the inversion signal of the i-th tri-state inversion signal output by the first inverter according to the clock signal and the inversion clock signal to generate the i-th tri-state inversion signal;

a third tri-state inverter, for performing the tri-state inversion on the i-th tri-state inversion signal according to the clock signal and the inversion clock signal to obtain the input signal of the (i+1)-th trigger signal generating stage;

a second inverter, for performing the inversion on the input signal of the (i+1)-th trigger signal generating stage output by the third tri-state inverter to obtain an inversion signal thereof;

a fourth tri-state inverter, for performing the tri-state inversion on the inversion signal of the input signal of the (i+1)-th trigger signal generating stage according to the clock signal and the inversion clock signal to generate the input signal of the (i+1)-th trigger signal generating stage;

an NAND gate, for performing an NAND logic operation according to the inversion signal of the input signal of the (i+1)-th trigger signal generating stage and an (i+1)-th logic signal output by the (i+1)-th trigger signal generating stage to generate an NAND signal; and a third inverter, for receiving and performing the inversion on the NAND signal to generate the i-th trigger signal.

8. The driving circuit as claimed in claim 7, wherein the i-th logic gate comprises:

a first transistor electrically connected to a voltage source, for determining the on/off state according to the i-th tri-state inversion signal;

a second transistor electrically connected to the first transistor, for determining the on/off state according to the input signal of the (i+1)-th trigger signal generating stage;

a third transistor electrically connected to the second transistor, for determining the on/off state according to the i-th tri-state inversion signal;

a fourth transistor electrically connected between the third transistor and a ground end, for determining the on/off state according to the inversion signal of the input signal of the (i+1)-th trigger signal generating stage;

a fifth transistor electrically connected to the voltage source, for determining the on/off state according to the inversion signal of the i-th tri-state inversion signal;

a sixth transistor electrically connected to the fifth transistor, for determining the on/off state according to the inversion signal of the input signal of the (i+1)-th trigger signal generating stage;

a seventh transistor electrically connected to the sixth transistor and the second transistor, for determining the on/off state according to the inversion signal of the i-th tri-state inversion signal, and outputting the i-th logic signal at the point where the seventh transistor, the sixth transistor, the second transistor, and the third transistor electrically connected one another; and an eighth transistor electrically connected between the seventh transistor and the ground end, for determining the on/off state according to the input signal of the (i+1)-th trigger signal generating stage.

9. The driving circuit as claimed in claim 7, wherein the scanning circuit further comprises a fourth inverter for receiving the clock signal to generate the inversion clock signal.

10. The driving circuit as claimed in claim 6, wherein the input signal of the first trigger signal generating stage is an external input signal.

* * * * *